United States Patent
Swanson

(10) Patent No.: US 6,417,523 B1
(45) Date of Patent: Jul. 9, 2002

(54) ORGANIC EDGE EMITTING DIODE WITH LIGHT GUIDE AND PIXEL ISOLATION

(75) Inventor: Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/482,760

(22) Filed: Jan. 13, 2000

Related U.S. Application Data

(60) Provisional application No. 60/116,622, filed on Jan. 19, 1999.

(51) Int. Cl.[7] .............................. H01J 1/62; H01J 63/04
(52) U.S. Cl. ...................... 257/88; 257/81; 313/169.1; 313/169.3; 313/505; 313/506; 313/512
(58) Field of Search ............................. 257/79, 81, 82, 257/89–90, 94, 95, 88, 99; 313/500, 505–506, 509, 169.1, 169.3, 512; 347/238, 245

(56) References Cited

U.S. PATENT DOCUMENTS

| 5,150,006 A | | 9/1992 | Van Slyke et al. ........... 504/504 |
| 5,321,416 A | | 6/1994 | Bassett et al. .................. 345/8 |
| 5,347,400 A | | 9/1994 | Hunter ........................ 359/815 |
| 5,525,866 A | * | 6/1996 | Mach et al. ............. 315/169.3 |
| 5,552,678 A | | 9/1996 | Tang et al. ............... 315/169.3 |
| 5,554,450 A | | 9/1996 | Shi et al. ..................... 428/690 |
| 5,619,373 A | | 4/1997 | Meyerhofer et al. ......... 359/482 |
| 5,619,377 A | | 4/1997 | Rallison ..................... 359/631 |
| 5,811,931 A | * | 9/1998 | Mueller-Mach et al. ..... 313/512 |
| 5,903,243 A | * | 5/1999 | Jones ............................. 345/7 |
| 5,962,970 A | * | 10/1999 | Yokio et al. ................ 313/506 |
| 6,075,317 A | * | 6/2000 | Keyser et al. .............. 313/505 |

\* cited by examiner

Primary Examiner—Minh Loan Tran
Assistant Examiner—Thomas L Dickey
(74) Attorney, Agent, or Firm—Jacqueline J. Garner; W. James Brady, III; Frederick J. Telecky, Jr.

(57) ABSTRACT

An edge emitter (12) includes a diode array (20) with an emissive edge (22). The diode array (20) is formed on a substrate layer (24) that includes integrated driver circuits (23) to power the diode array (20). Dielectric posts (26) are formed on the substrate layer to provide optical isolation for each light emitting diode (28) of the diode array (20). A reflective metal coating (29) is formed on the substrate layer (24) and the dielectric posts (26). A light guide layer (30) is formed on the reflective coating (29) followed by the formation of an anode layer (32), an organic semiconductor layer (34), and a cathode layer (36). Vias (38) are formed from the anode layer (32) and the cathode layer (36) to the integrated driver circuits (23). The emissive edge (22) of each light emitting diode (28) in the diode array (20) has a height and width approximately one-tenth that of its length.

7 Claims, 1 Drawing Sheet

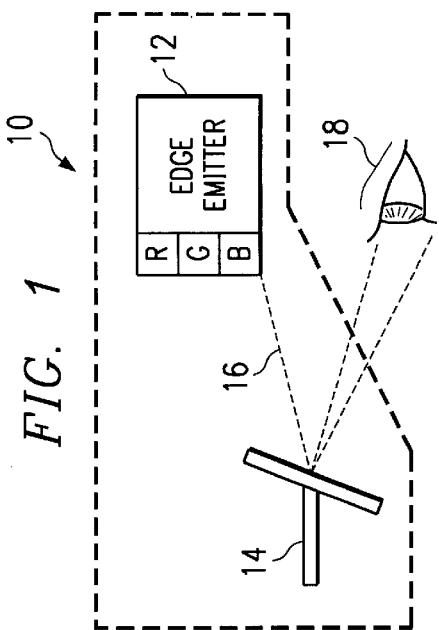
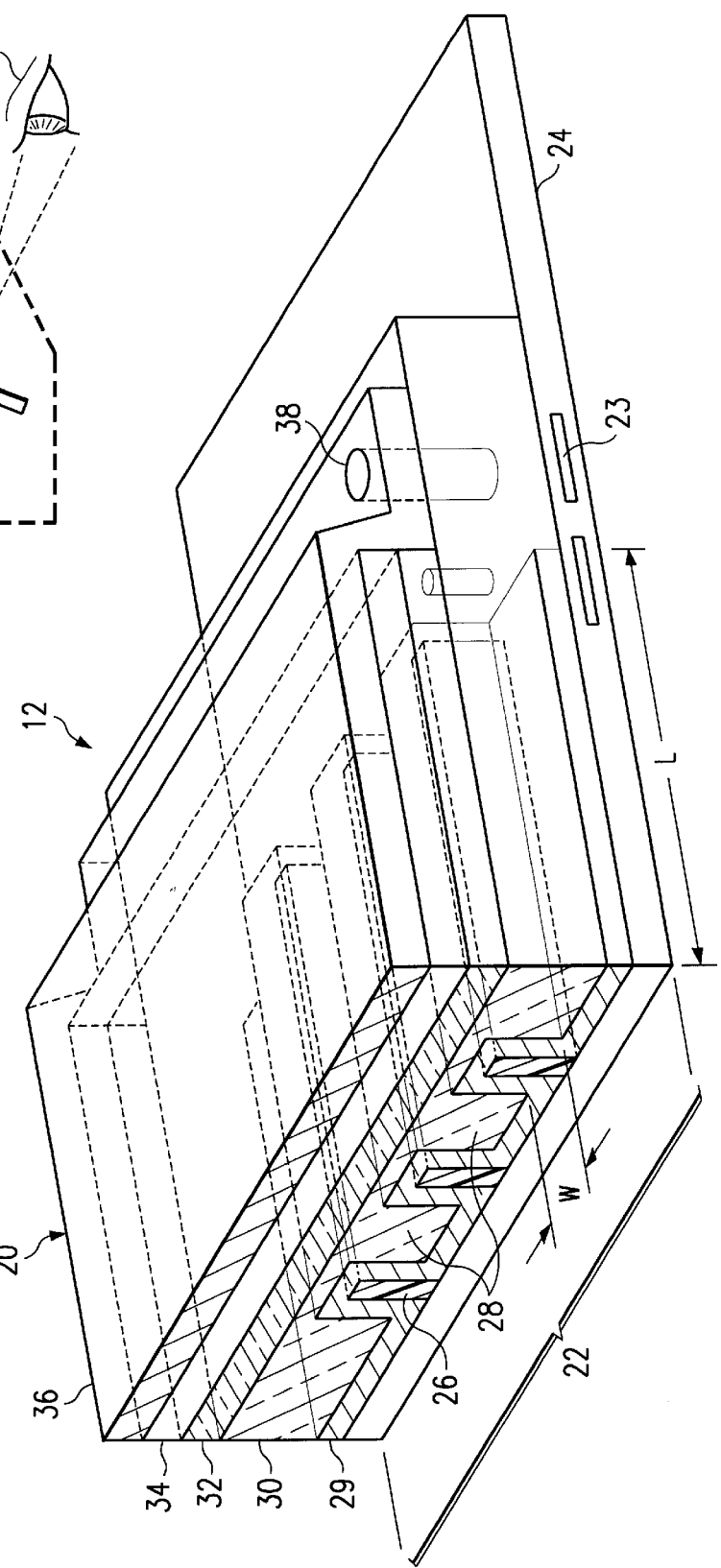

ORGANIC EDGE EMITTING DIODE WITH LIGHT GUIDE AND PIXEL ISOLATION

This application claims priority under 35 USC §119(e)(1) of provisional application No. 60/116,622 filed Jan. 19, 1999.

TECHNICAL FIELD OF THE INVENTION

The present invention relates in general to display devices and more particularly to an edge emitting organic light emitting diode.

BACKGROUND OF THE INVENTION

Conventional displays are large, heavy, expensive, and require a relatively large amount of electrical power, especially portable computer displays. Several different types of displays exist, including passive matrixed addressed displays and conventional organic light emitting diode displays. The different types of displays have various disadvantages that may affect the performance of the display.

Passive matrixed addressed displays suffer from crosstalk or spurious outputs from unaddressed pixels due to leakage current flow in reversed biased unaddressed pixels. Further, as the number of rows increases, very short duty cycles are required. Duty cycle is inversely proportional to the number of rows of the display and thus the peak current density and peak luminance increases with the number of rows. Each pixel in a 1000 row display has a duty cycle of 0.1%. The peak current density during bias is 1000 times the DC level required for the same average luminance. Such a situation leads to reliability problems in the display.

For conventional organic light emitting diodes, it is difficult to fabricate full color displays due to the patterning required for the various color organic semiconductors. Further, sensitivity of the organic semiconductors makes patterning above them a difficult task. Added expense is incurred in order to attach driver circuits to the display. Therefore, it is desirable to provide a more reliable and cost effective display.

SUMMARY OF THE INVENTION

From the foregoing, it may be appreciated that a need has arisen for an edge emitting display device that is more reliable and less difficult to fabricate than conventional display devices. In accordance with the present invention, an edge emitting organic light emitting diode is provided that substantially eliminates or reduces disadvantages and problems of conventional display devices.

According to an embodiment of the present invention, there is provided an edge emitting organic light emitting diode that includes a substrate layer with display drivers incorporated therein. A first emitter array is formed above the substrate layer. A second emitter array is formed above the first emitter array. A third emitter array is formed above the second emitter array. The first, second, and third emitter arrays provide the colors red, green, and blue for a plurality of pixels associated with each emitter array.

The present invention provides various technical advantages over conventional display devices. For example, one technical advantage is in having organic semiconductor color layers formed over a substrate that incorporates display drivers for each color layer. Another technical advantage is in fabricating a display device without patterning the various organic semiconductor color layers or patterning a metal layer above the color layers. Yet another technical advantage is in eliminating crosstalk among pixels. Still another technical advantage is in reducing the peak currents needed to operate the display device, thus improving reliability. Other technical advantages may be readily apparent to those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 1 illustrates a simplified block diagram of a heads up display;

FIG. 2 illustrates a simplified structure for an edge emitter of the heads up display.

DETAILED DESCRIPTION OF THE INVENTION

FIG. 1 is a simplified block diagram of a heads up display 10. Heads up display 10 includes an edge emitter 12 and a reflecting unit 14. In operation, light 16 from each of the colors red, green, and blue edge emitter 12 is directed onto reflecting unit 14 and covers an upper half of a user's field of view. Reflecting unit 14 scatters light 16 from edge emitter 12 into the user's eye 18. Reflecting unit 14 scans light 16 generated by edge emitter 12 across a retina of the user's eye 18 through rotation or oscillation, thereby producing an image to be seen by the user. Sweeping light 16 across the retina gives the user an illusion that edge emitter 12 is a flat display being addressed one row at a time. Heads up display 10, in one embodiment, may appear as a 1000× 1000 pixel display with similar color, brightness, and resolution as a flat panel display. Edge emitter 12 preferably has an organic light emitting diode (OLED) like structure. Reflecting unit 14 may be a mirror or any other suitable reflecting element. Typical applications for heads up display 10 include virtual reality configurations, infrared night vision units, handheld portable televisions, and portable computers.

FIG. 2 is a simplified structural diagram of a portion of edge emitter 12. Edge emitter 12 includes three diode arrays 20 stacked above each other with only one diode array 20 shown for ease of illustration and discussion. Each diode array 20 produces a different color, such as red, green, and blue at an emissive edge 22, so that the total structure produces full color. Each diode array 20 is preferably constructed to be about ten times longer at length L than it is wide at width W. In a preferred embodiment, a light emitting diode 28 of diode array 20 preferably has emitting surface of about 30×30 $\mu m^2$ with diode array 20 being about 300 $\mu m$ long.

The structure for edge emitter 12 includes a substrate layer 24 that includes integrated driver circuits 23 to power the diode arrays 20. Dielectric posts 26 are formed on substrate layer 24. Dielectric posts 26 form the optical isolation structures of each light emitting diode 28 representing a pixel of diode array 20. A reflective metal coating 29 is formed on substrate layer 24 and dielectric posts 26. A light guide layer 30 is formed on reflective metal coating 29 to act as a multimode light guide for light emitting diode 28. An anode layer 32 is formed on light guide layer 30. An organic semiconductor layer 34 separates anode layer 32 from a cathode layer 36. Vias 38 are provided from anode layer 32 and cathode layer 36 to driver circuits 23. A second and third diode array may be formed over diode array 20 beginning at cathode layer 36 to provide full color display.

Anode layer 32 is preferably patterned between the dielectric posts and preferably is made of a material which includes indium tin oxide (ITO). The power requirements of a device incorporating edge emitter 12 may be significantly less than that of a liquid crystal display flat panel device. Heads up display 10 may use only 40 μW of power for the emitter and circuitry plus an additional amount for the drive mechanism of reflecting unit 14 as compared to 4 W for the liquid crystal display flat panel device. The one dimensional nature of diode array 20 eliminates crosstalk in unaddressed pixels whether or not individual pixels have leakage. Fabrication is facilitated by avoiding the patterning of organic semiconductor layer 34 and cathode layer 36. Light guide layer 30 is preferably formed of a transparent dielectric material. Integrating driver circuits 23 into substrate layer 24 eliminates the expense of attaching driver circuits to the display. Thus, all silicon processing is completed to allow formation of diode array 20. Diode array 20 may have any number of light emitting diodes 28 to establish a desired pixel count for heads up display 10.

Thus, it is apparent that there has been provided, in accordance with the present invention, an edge emitting device that satisfies the advantages set forth above. Although the present invention has been described in detail, it should be understood that various changes, substitutions, and alterations readily ascertainable by those skilled in the art may be made herein without departing from the spirit and scope of the present invention as defined by the following claims.

What is claimed is:

1. An integrated edge emitting device, comprising:

a substrate layer;

a plurality of dielectric posts formed on the substrate layer;

a reflective coating formed on the plurality of dielectric posts and the substrate layer;

a light guide layer formed on the reflective coating to define a plurality of light guides, each light guide located between adjacent ones of the plurality of dielectric posts, having an emitting surface at an end that has a width substantially smaller than the length of the light guide along the adjacent ones of the plurality of dielectric posts;

an anodes layer formed on the light guide layer, the anode layer patterned to define a plurality of light emitting diodes, each light emitting diode corresponding to one of the plurality of light guides;

an organic semiconductor layer formed on the anode layer; and a cathode layer formed on the organic semiconductor layer.

2. The integrated edge emitting device of claim 1, wherein the substrate layer includes driver circuits connected to the patterned anode layer and to the cathode layer, for powering the plurality of light emitting diodes.

3. The integrated edge emitting device of claim 2, further comprising:

first plurality of vias connecting the patterned anode layer to the driver circuits;

at least one second via connecting the cathode layer to the driver circuits.

4. The integrated edge emitting device of claim 1, wherein the anode layer is made of a material which includes indium tin oxide.

5. The integrated edge emitting device of claim 1, wherein the light guide layer is formed of a transparent dielectric material.

6. The integrated edge emitting device of claim 1, wherein the plurality of light emitting diodes produces one of the colors red, green, and blue.

7. A heads up display, comprising:

an edge emitting device, comprising:

a substrate layer, having driver circuits formed therein;

three diode arrays stacked one on another, the three diode arrays representing the colors red; green; and blue; and each comprising:

a plurality of dielectric posts formed on the substrate layer;

a reflective coating formed on the plurality of dielectric posts and the substrate layer;

a light guide layer formed on the reflective coating to define a plurality of light guides, each light guide located between adjacent ones of the plurality of dielectric posts, having an emitting surface at an end that has a width substantially smaller than the length of the light guide along the adjacent ones of the plurality of dielectric posts;

an anode layer formed on the light guide layer, the anode layer patterned to define a plurality of light emitting diodes, each light emitting diode corresponding to one of the plurality of light guides;

an organic semiconductor layer formed on the anode layer; and a cathode layer formed on the organic semiconductor layer;

wherein the driver circuits are connected to the patterned anode layer and to the cathode layer in each of the diode arrays, for powering the plurality of light emitting diodes; and a reflecting unit operable to direct light emitted from each diode array of the edge emitting device.

* * * * *